United States Patent
Barnes et al.

(10) Patent No.: US 6,239,553 B1
(45) Date of Patent: May 29, 2001

(54) RF PLASMA SOURCE FOR MATERIAL PROCESSING

(75) Inventors: Mike Barnes, San Ramon; Tetsuya Ishikawa, Santa Clara; Kaveh Niazi, Santa Clara; Tsutomu Tanaka, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/296,934

(22) Filed: Apr. 22, 1999

(51) Int. Cl.[7] .............................. H01J 7/24; H05B 31/26
(52) U.S. Cl. ........................ 315/111.51; 315/111.81; 118/723 IR; 118/723 AN
(58) Field of Search ...................... 315/111.21, 111.51, 315/111.81, 111.91; 118/723 AN, 723 I, 723 IR; 219/121.48; 156/345

(56) References Cited

U.S. PATENT DOCUMENTS

| | | | |
|---|---|---|---|
| 3,705,091 | * 12/1972 | Jacob | 118/723 I |
| 4,849,675 | 7/1989 | Müller | 315/111.51 |
| 4,988,644 | 1/1991 | Jucha et al. | 437/225 |
| 5,194,731 | * 3/1993 | Turner | 315/111.51 |
| 5,241,245 | * 8/1993 | Barnes | 315/111.51 |
| 5,540,824 | 7/1996 | Yin et al. | 204/298.34 |
| 5,554,223 | * 9/1996 | Imahashi | 315/111.51 |
| 5,641,359 | 6/1997 | Yavelberg | 118/723 |
| 5,683,539 | 11/1997 | Qian et al. | 156/345 |
| 5,716,877 | 2/1998 | Yavelberg | 438/14 |
| 5,982,100 | * 11/1999 | Ghanbari | 315/111.21 |
| 6,028,395 | * 2/2000 | Holland et al. | |

* cited by examiner

Primary Examiner—Michael B Shingleton
(74) Attorney, Agent, or Firm—Thomason, Moser & Patterson

(57) ABSTRACT

The present invention provides a plasma source that maintains a low coil voltage in the vicinity of the plasma tube, thereby reducing the capacitive coupling between the coil and the plasma and significantly reducing the erosion from the internal surfaces of the plasma tube. The plasma source generally comprises a coil having a first coil segment and a second coil segment, an RF power source connected to the coil and an enclosure disposed between the first coil segment and the second coil segment. The invention also provides a method for generating a plasma, comprising: disposing an enclosure between a first coil segment and a second coil segment; introducing a gas into the enclosure; and supplying an RF power to the coil segments to excite the gas into a plasma state. The invention provides a variety of coil operations, including symmetrical coil configuration, asymmetrical coil configuration with the matching networks adjusted to provide a low voltage near the plasma chamber, self-resonant configuration, grounded coil center configuration having coil segments driven in parallel and physically grounded near the plasma chamber, and pairs configurations having a plurality of coil segment pairs driven in series or parallel.

37 Claims, 8 Drawing Sheets

RF PLASMA SOURCE FOR MATERIAL PROCESSING

BACKGROUND OF THE INVENTION

1. Field of the Invention

The present invention generally relates to plasma processing. More particularly, the present invention relates to a radio frequency (RF) plasma source for use in plasma material processing.

2. Background of the Related Art

Plasma material processes are widely used in the fabrication of integrated circuits on semiconductor substrates. These processes typically include etching, chemical vapor deposition, physical vapor deposition and other vacuum processes. During these processes, the semiconductor substrates are exposed to a gaseous plasma within a vacuum processing chamber. Radio frequency energy (RF between 3–30 MHz), typically at 13.56 MHz, is used to excite a processing gas that is supplied to the processing chamber and generate a plasma. The plasma may be generated within the processing chamber and/or introduced from a remote plasma generator to the processing chamber. Plasma generation within the processing chamber and remote plasma generation are both well known in the art. Each method of plasma generation has been utilized in a variety of plasma material processes. For example, remote plasma generation of a cleaning gas, such as $NF_3$, has been successfully utilized to clean deposition chambers or process kit components (e.g., gas distributors, clamp rings, etc.) made of ceramic or aluminum.

FIG. 1 is a simplified schematic view of a typical remote inductively coupled plasma source. The plasma source 100 generally comprises a tube 102, a coil 104 spirally wound outside and along the length of the tube 102 and an RF power source 106 connected to the coil 104. Generally, inductive coupling, as shown in FIG. 1, is preferred over capacitive coupling because the plasma density generated by inductive coupling for a given power is higher than that generated by capacitive coupling with the same power. The higher plasma density generally results in an increased reaction rate, shorter processing time and higher throughput. The RF power source 106 supplies to the coil 104 the RF energy needed to generate a plasma within the tube. Typically, an RF match network 108 is connected between the RF power source 106 and the coil 104 to provide an impedance match between the RF power source 106 and the coil 104. The impedance match ensures that the RF power supplied to the coil 104 is not reflected back to the RF power source 106 and provides optimal power transfer between the RF power source 106 and the coil 104. The tube 102 includes a process gas inlet 110 disposed on one end and a plasma outlet 112 disposed on the other end. The process gas inlet 110 is fluidly connected to a processing gas source (not shown), and the plasma outlet 112 is fluidly connected to a processing chamber (not shown). The remote plasma source 100 is generally mounted on a surface of the chamber enclosure, typically on top of a lid to the chamber enclosure.

During processing, the processing gas is introduced into the tube 102 through the process gas inlet 110, and the RF power source 106 is activated to supply an RF power to the coil 104. The RF power energizes the coil 104 and produces an RF field within the tube 102 that excites the processing gases to a plasma state. The plasma then flows out of the plasma outlet 112 into the processing chamber. Typically, the processing gas is continuously introduced into the tube 102 and excited to a plasma to provide a continuous plasma supply into the processing chamber throughout the processing period.

Typically, the RF power source supplies a high peak-to-peak voltage on the order of a few kilo volts to one end of the coil 104 while the other end of the coil 104 is grounded. A problem with the inductive RF coil having one end grounded and the other end connected to a high voltage is that the high RF peak-to-peak potential causes strong capacitive coupling of RF power into the plasma generated within the tube 102. The strong capacitive coupling of RF power into the plasma is undesirable because it reduces the RF energy being inductively coupled to the plasma as intended by the coil 104. Capacitive coupling generally presents a large sheath voltage near the dielectric tube. The high voltage near the tube 102 causes significant erosion of the interior surface of the tube 102 as ions from the plasma are accelerated by the large sheath voltage to impinge on the dielectric tube material. The erosion on the tube 102 reduces the useful life of the tube and leads to contaminant generation during processing that may cause defects on substrates. The erosion also reduces the useful life of the tube as well as the remote inductively coupled plasma source, which results in additional costs and processing down-time for repairs and/or replacements. Furthermore, it is desirable to reduce or minimize the capacitive coupling because minimizing the capacitive coupling generally leads to a higher density plasma for a given power.

Therefore, there is a need for a remote inductively coupled plasma source that maintains a low coil voltage in the vicinity of the plasma tube, thereby reducing the capacitive coupling between the coil and the plasma and the erosion from the internal surfaces of the plasma tube.

SUMMARY OF THE INVENTION

The present invention provides a plasma source that maintains a low coil voltage in the vicinity of the plasma tube, thereby reducing the capacitive coupling between the coil and the plasma and significantly reducing the erosion from the internal surfaces of the plasma tube.

The plasma source generally comprises a coil having a first coil segment and a second coil segment, an RF power source connected to the coil and an enclosure disposed between the first coil segment and the second coil segment. Preferably, a first RF match network is connected between the RF power source and the first coil segment, and a second RF match network is connected between the second coil segment and a ground.

Alternatively, each coil segment is connected to a capacitor to operate in a self-resonant mode to simplify the RF match network. Preferably, one capacitor is connected to each outer end of the coil segments, and the RF power source is connected to one of the coil segments or to the middle segment between the first and second coil segments.

Another aspect of the invention provides a zero-voltage in the vicinity of the enclosure by grounding the inner ends of the coil segments. In this coil configuration, the RF power source is connected to the outer ends of the coil segments, and preferably, an RF match network is connected between the RF power source and the coil segments. As an alternative to separately grounding the inner ends of the coil segments, a middle coil segment connecting the first and second coil segments is grounded to provide a zero-voltage in the vicinity of the enclosure.

The invention also provides a method for generating a plasma, comprising: disposing an enclosure between a first coil segment and a second coil segment of a coil; introducing a gas into the enclosure; and supplying an RF power to the coil to excite the gas into a plasma. The invention provides a variety of coil operations, including symmetrical coil configuration, asymmetrical coil configuration with the matching networks adjusted to provide a low voltage near the plasma chamber, self-resonant configuration, grounded coil center configuration having coil segments driven in parallel and physically grounded near the plasma chamber, and pairs configurations having a plurality of coil segment pairs driven in series or parallel. In addition, the inductive coupling between the coils and the plasma can be enhanced by using coil segments having ferrite cores.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
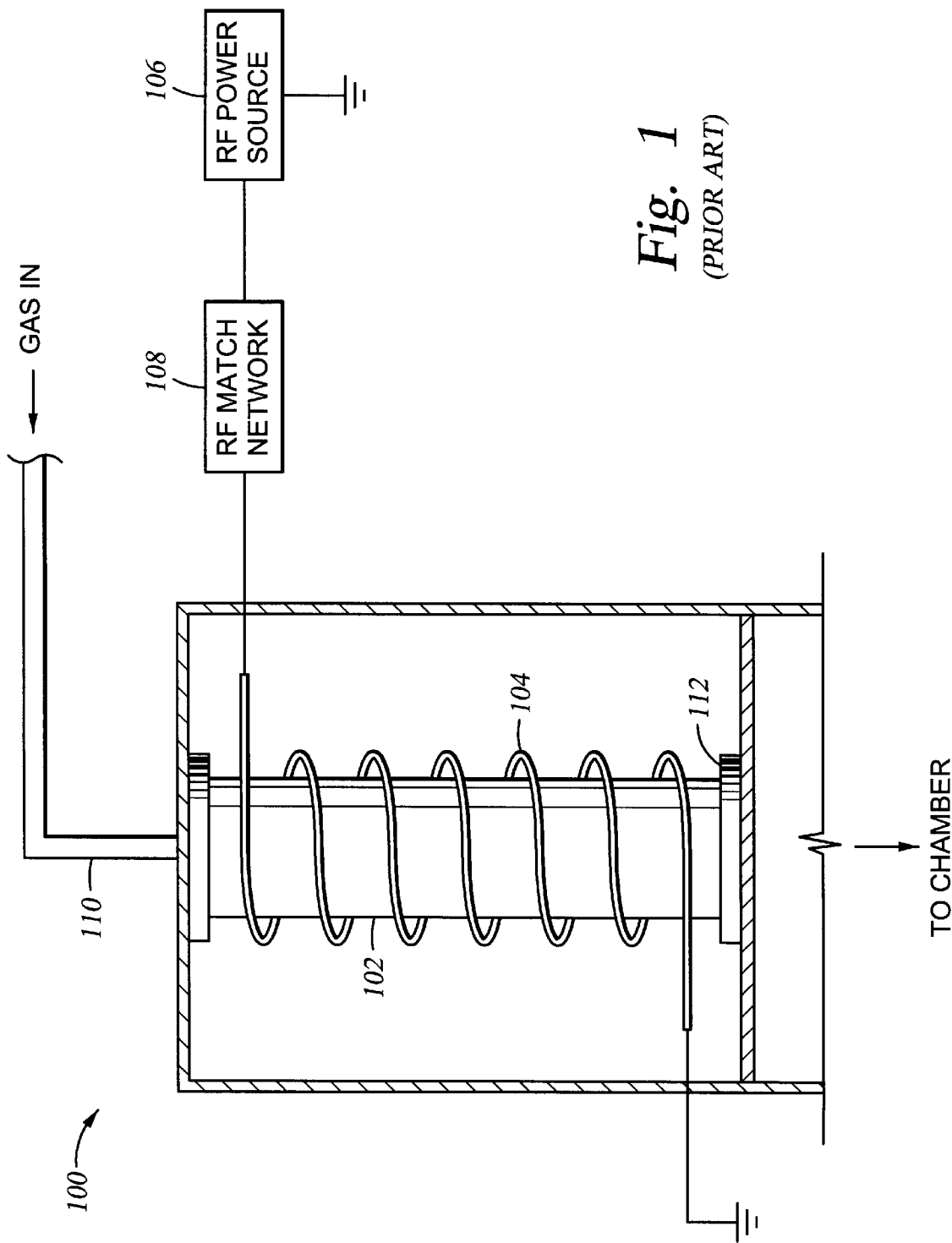
FIG. 1 is a simplified schematic view of a typical remote inductively coupled plasma source.
Figure 2:
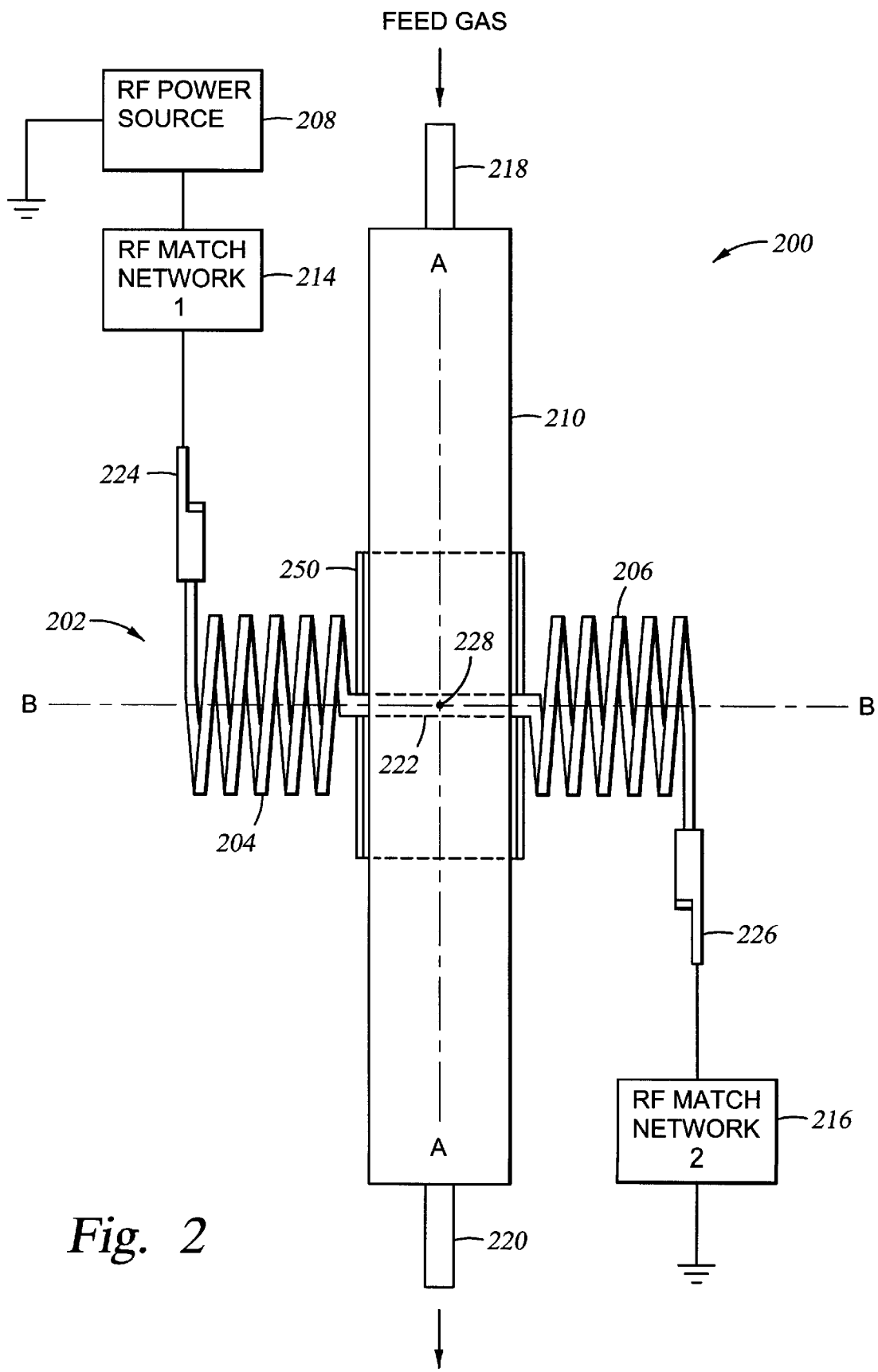
FIG. 2 is a schematic view of a plasma source according to the invention.

FIG. 2 is a schematic view of a plasma source according to the invention. The plasma source 200 generally comprises a coil 202 having a first coil segment 204 and a second coil segment 206, an RF power source 208 connected to the coil 202 and an enclosure 210 disposed between the first coil segment 204 and the second coil segment 206. The enclosure 210 is disposed at an angle to the coil, preferably, at an angle substantially perpendicularly (i.e., ±10 degrees) to the coil 202 such that an axis A through the enclosure 210 is substantially perpendicular to an axis B through the coil 202. Preferably, a first RF match network 214 is connected between the RF power source 208 and the first coil segment 204, and a second RF match network 216 is connected between the second coil segment 206 and a ground.

Figure 4:
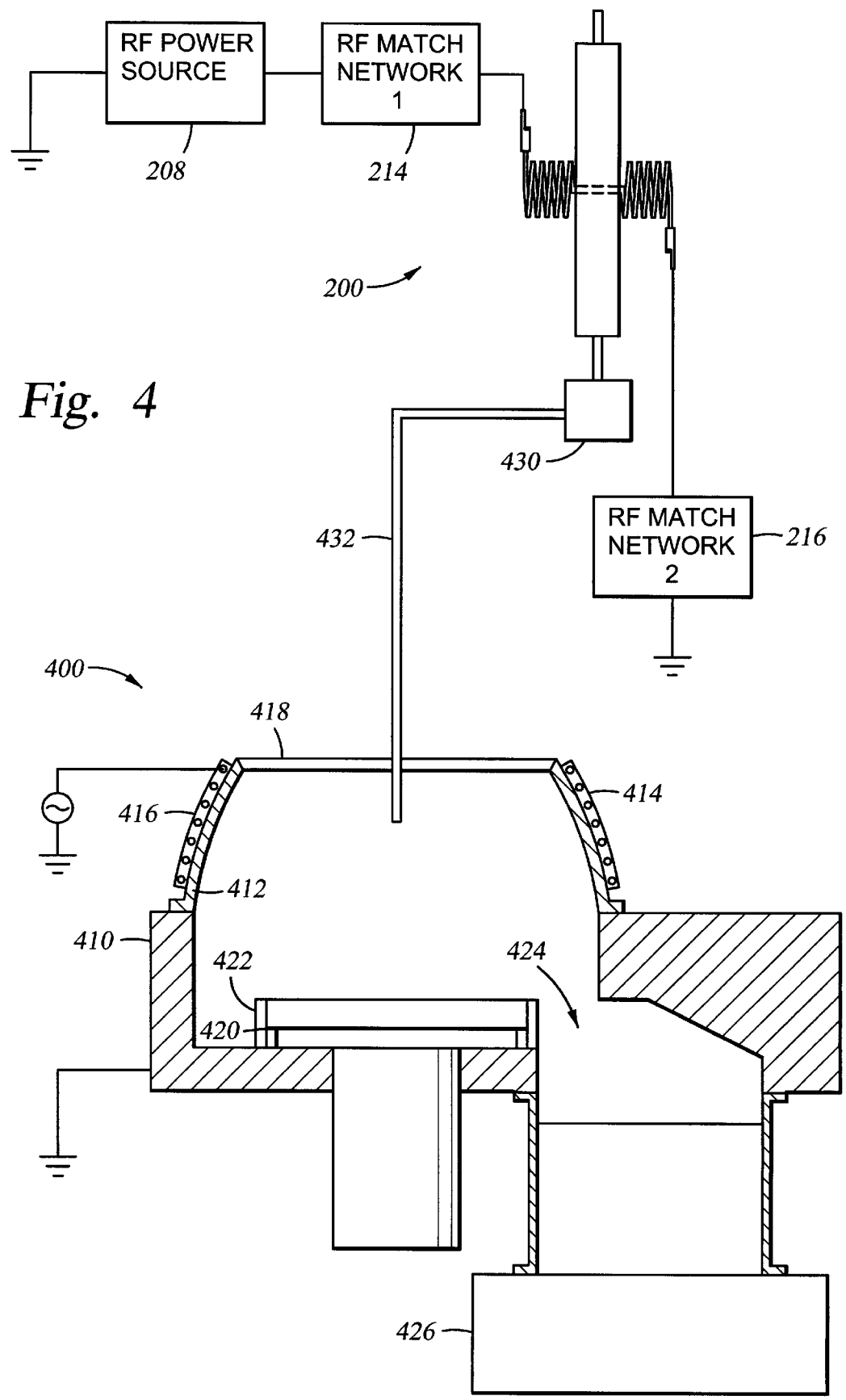
FIG. 4 is a schematic view of a processing chamber utilizing a plasma source according to the invention.

The enclosure 210 includes a gas inlet 218 and a plasma outlet 220 disposed on opposite ends of the enclosure 210. The gas inlet 218 is fluidly connected to a processing gas source (not shown), and the processing gas is introduced through the gas inlet 218 into the enclosure 210. The processing gas, as contemplated by the present invention, includes a variety of deposition gases, as well as etching gases. The plasma outlet 220 is fluidly connected to a processing chamber (an example is shown in FIG. 4), and the plasma generated inside the enclosure 210 flows to the processing chamber through the plasma outlet 220. Alternatively, the plasma outlet 220 is fluidly connected to a pump (shown in FIG. 4) that pumps the plasma from the enclosure 210 to the processing chamber through a pump outlet conduit (shown in FIG. 4) connected to the chamber.

Preferably, the enclosure 210 comprises a tube and is made of a dielectric material, such as quartz. Alternatively, the materials such as a resistive or semiconductive material, can also be used for the enclosure 210. The particular material for the construction of the enclosure 210 is determined according to the process gas to be input into the system. For example, for generation of a plasma from a processing gas comprising $NF_3$, the preferred material for the construction of the enclosure 210 is sapphire because, among other things, sapphire has a high resistance to erosion by the active species formed in the plasma. The enclosure 210, as shown in FIG. 2, is a generally cylindrical enclosure prevalently available in the industry and used in typical remote inductively coupled plasma sources. However, enclosures having other cross sectional shapes, such as a rectangular enclosure, are contemplated by the present invention. The enclosure 210 may also include a cooling jacket (not shown) that cools the enclosure using a gas coolant or a liquid coolant.

Figure 8C:
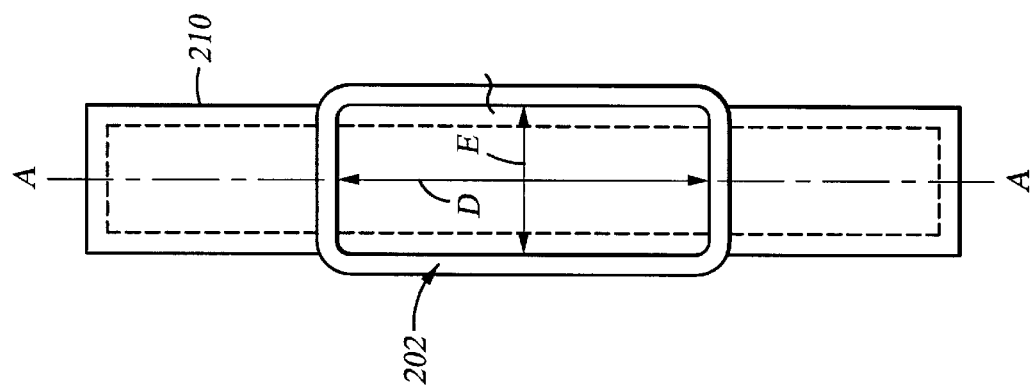
FIGS. 8a–8c are schematic views of coil cross sectional shapes.
Figure 8B:
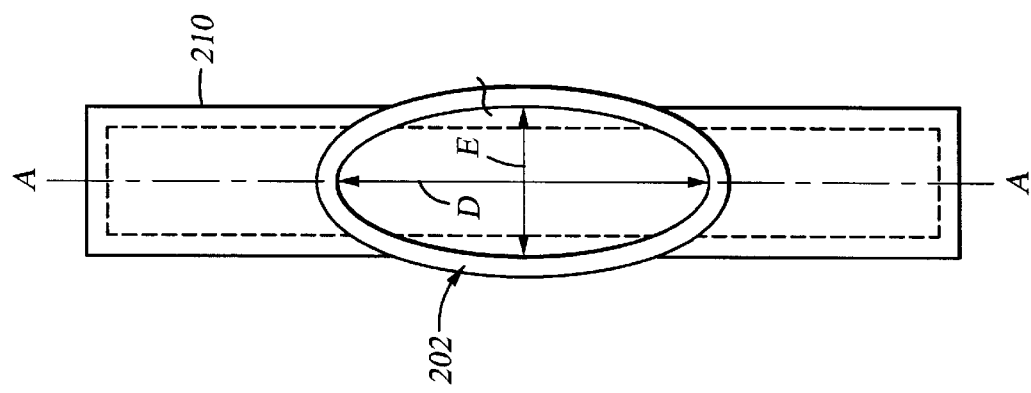
Figure 8A:
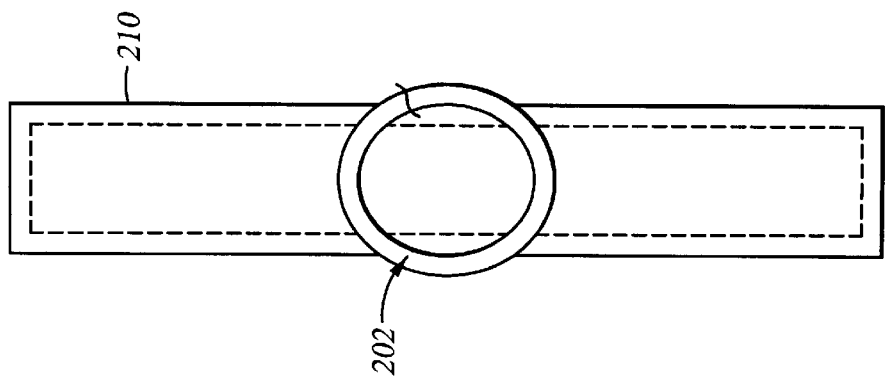

The enclosure 210 is disposed between the first coil segment 204 and the second coil segment 206 of the coil 202, preferably in a substantially perpendicular manner such that axis A through the enclosure 210 is substantially perpendicular to axis B through the coil 202. The coil 202 has a cross sectional shape that intersects a middle section of the enclosure 210, and the inner diameter of the cross sectional shape of the coil 202 preferably has about the same dimension as the inner diameter of the enclosure 210 to maximize the coupling efficiency. For example, a coil having a circular cross sectional shape (as shown in FIG. 8a) preferably has an inner diameter that is about the same dimension as an inner diameter of a cylindrical plasma tube. Because the RF field is produced in the region between the first coil segment 204 and the second coil segment 206, an increased intersection between the cross sectional area of the coil 202 and the enclosure 210 produces an increased active RF region within the enclosure 210 for generating the plasma. Preferably, the coil 202 has an elongated cross sectional shape having a long cross sectional axis D extending in the same direction as the enclosure axis A. These elongated cross sectional shapes include elliptical (as shown in FIG. 8b), rectangular (as shown in FIG. 8c) and other cross sectional shapes having a long axis and a short axis. Preferably, the short axis E of the coil has about the same dimension as the inner diameter or width of the enclosure. The elongated cross sectional shape provides an increased cross sectional area of the coil 202 that intersects the middle section of the enclosure 210 which results in an increased active region for exciting the gas within the enclosure 210 to a plasma. By increasing the active region for exciting the gas within the enclosure 210, the coupling efficiency from the coil 202 to the enclosure 210 is improved (as compared to the coupling efficiency of a coil having a circular cross section). In addition, the inductive coupling between the coil and the plasma can be enhanced by using coil segments having ferrite cores.

The coil 202 comprises the first coil segment 204 and the second coil segment 206 joined by a middle segment 222. The middle segment 222 provides the spacing to accommodate the placement of the enclosure 210 between the first coil segment 204 and the second coil segment 206 while providing continuity between the two segments. The middle segment 222 provides a voltage node (i.e., a region of low voltage with respect to ground) between the coil segments 204, 206 where the enclosure 210 is disposed. As shown in FIG. 2, the middle segment 222 provides a horizontal extension between the two segments. The second coil segment 206 continues the spiral of the coil substantially where the first coil segment 204 ends, except that the spiral continuation is offset by the length of the middle segment 222. Preferably, the first and second coil segments 204, 206 comprise solenoidal windings. In one embodiment, the coil segments are in a symmetrical configuration wherein the first coil segment 204 and the second coil segment 206 are substantially equally spaced from the exterior surface of the enclosure 210 and are identical in the number of turns, the direction of the turns, the cross sectional shape and the material of construction.

The coil design according to the invention maintains a low coil voltage in the vicinity of the enclosure 210, thereby reducing capacitive coupling to the plasma. Preferably, the coil design provides a near-zero voltage between the first coil segment 204 and the second coil segment 206 where the enclosure 210 is disposed. The invention contemplates many coil operation configurations, including: symmetrical coil configuration, asymmetrical coil configuration with the matching networks adjusted to provide a low voltage near the plasma chamber, self-resonant configuration, grounded coil center configuration having coil segments driven in parallel and physically grounded near the plasma chamber, and pairs configurations having a plurality of coil segment pairs driven in series or parallel.

An RF power source 208 is connected to the coil 202 to supply the RF energy required to generate the RF field to excite the gas within the enclosure 210. Preferably, a first RF match network 214 is connected between the RF power source 208 and the first coil segment 204, and a second RF match network 216 is connected between the second coil segment 206 and a ground. The first RF match network 214 is connected to the first coil segment 204 through a first coil terminal 224, while the second RF match network 216 is connected to the second coil segment 206 through a second coil terminal 226. The RF match networks 214, 216 provide an impedance match between the RF power supply 208 and the coil 202 that maximizes power transfer therebetween. The impedance match also ensures that the RF power supplied to the coil 202 is not reflected back to the RF power source 208.

Optionally, a faraday shield 250 is disposed between the enclosure 210 and the coil segments 204, 206 to remove the remaining capacitive fields from the remote plasma source. The faraday shield generally comprises a slotted conductor that shorts out the remaining capacitive fields from the coil segments. Faraday shields are generally known in the art.

In operation, a processing gas is introduced into the enclosure 210 through the gas inlet 218. The RF power source 208 then supplies the RF energy to the coil 202 to excite the gas within the enclosure 210 into a plasma state. The plasma flows out of the enclosure 210 through the plasma outlet 220 into a processing chamber (shown in FIG. 4). A pump (shown in FIG. 4) can be placed in fluid communication between the plasma outlet 220 and the processing chamber to enhance transfer of the plasma from the remote inductively coupled plasma source 200 to the processing chamber.

Figure 3:
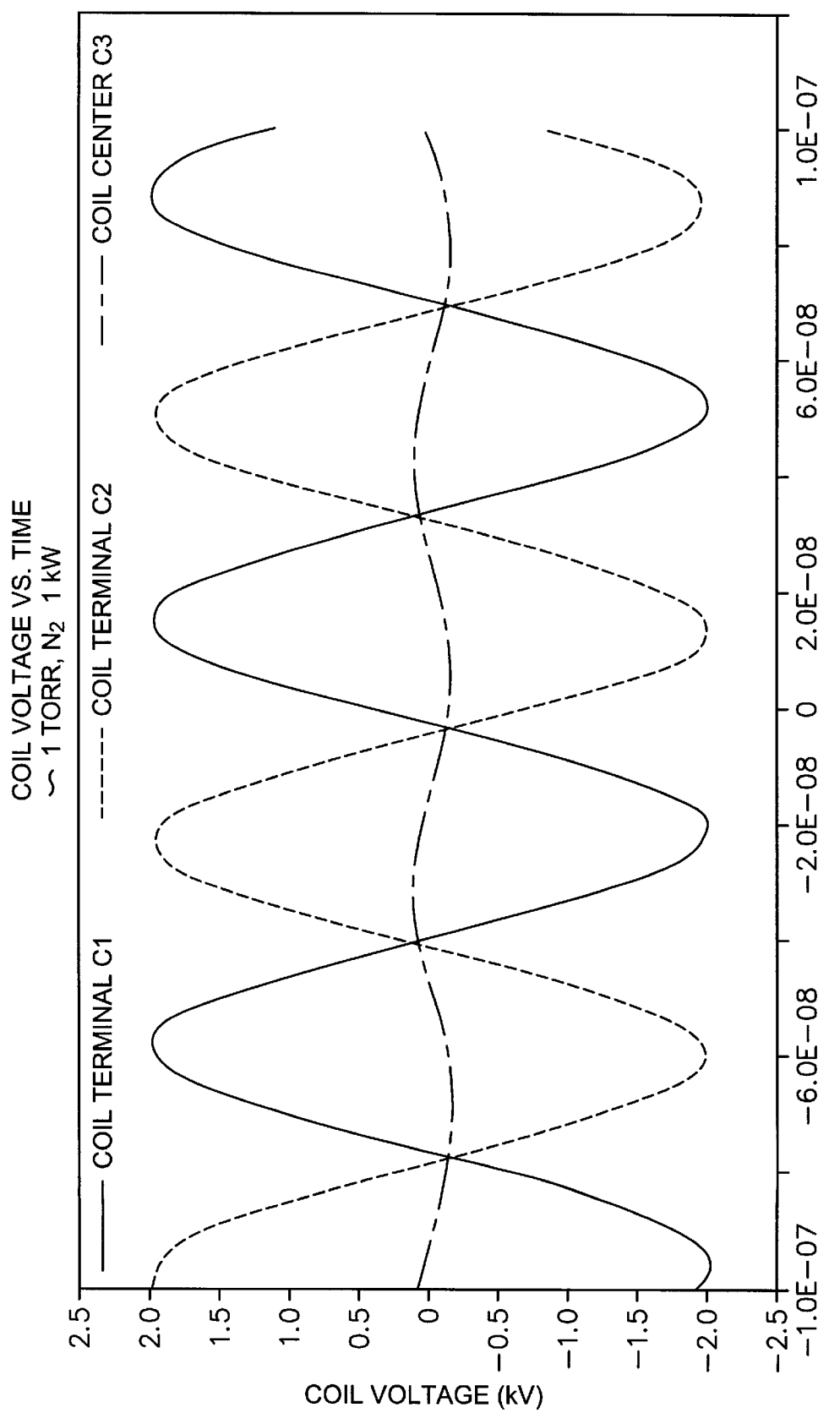
FIG. 3 is a graph showing exemplar voltages at the coil terminals and the coil center of the plasma source according to the invention.

FIG. 3 is a graph showing exemplar voltages at the coil terminals 224, 226 and the coil center 228 of the plasma source according to the invention. For the graph shown in FIG. 3, the RF power source 208 supplied an RF power of about 1 kW with a voltage of about 2 kV peak-to-peak to the coil 202. Typically, the RF power source supplies the RF power at about 13.56 MHz. The voltage at the first coil terminal 224 varies between about −2 kV and about 2 kV while the voltage at the second coil terminal 226 also varies between about −2 kV and about 2 kV. However, the voltages are almost completely out of phase. Thus, as the voltage at the first coil terminal peaks near 2 kV, the voltage at the second coil terminal reaches a negative peak near −2 kV. The voltage at the coil center 228, which corresponds to a central point of the middle segment 222, cycles at about near-zero voltages between about 200 V and −200 V. The low peak-to-peak voltage at the coil center 228, as compared to the high peak-to-peak voltages at the coil terminals 224, 226, is important because the enclosure 210 is disposed in this region. Because there are no high voltages present near the enclosure 210, the capacitive coupling from the coil 202 to the enclosure 210 is significantly reduced and practically eliminated. By maintaining a low peak-to-peak voltage in the vicinity of the enclosure 210, the erosion from the internal surface of the enclosure is significantly reduced.

FIG. 4 is a schematic view of a processing chamber utilizing a plasma source according to the invention. Although the present invention will be described in reference to an HDP-CVD processing system, the invention may be used to advantage in other plasma processing systems. FIG. 4 is a cross sectional view of an HDP-CVD chamber having a remote inductively coupled plasma source according to the invention. The chamber 400 generally includes a chamber body 410 which is typically made of aluminum and functions as an anode. The chamber body 410 supports a dielectric dome 412 on its upper edge around which an inductive coil 414 is located to provide an inductive plasma source. A conducting or semi-conducting chamber lid 418 is supported on the upper surface of the dielectric dome 412 and functions as another anode within the chamber. An electrostatic chuck 420 is positioned in the lower portion of the chamber to support a substrate thereon during processing. An insulative ring 422 made of a dielectric material, such as a ceramic, is typically positioned around the outer perimeter of the electrostatic chuck 420 to prevent arcing between the electrostatic chuck and the grounded chamber walls. Gases are inlet through gas inlets 415 located around the perimeter of the chamber body 410 and in the chamber lid 418 above the electrostatic chuck 420. The chamber is exhausted through an exhaust passage 424 positioned outwardly of the outer edge of the electrostatic chuck 420 by an exhaust pump 426. A throttle and gate valve assembly control pressure within the chamber by controlling the exhaust of gases out of the chamber.

Typically, a high density plasma is generated within the processing chamber by providing an RF voltage through the inductive coil adjacent the dielectric dome, referred to as source RF. The RF voltage applied to the coil and the lid excite a gas introduced into the chamber into a plasma state. In addition, an RF voltage may be coupled to the chamber lid 18 to provide a bias RF signal into the chamber. Depending on the application, precursor gases may be introduced into the chamber to deposit a material onto the substrate or etch material from the substrate to form integrated circuits on the substrate.

The conducting or semi-conducting lid 418, the dielectric ring 422, the ceramic dome 412, the enclosure wall 410 and gas inlets 415, all of which form a part of the plasma processing region, are sources of contaminant material which may be volatilized into the gas phase under operating conditions within the chamber, thereby contaminating the processing environment. Specifically, mobile ions such as Na, Li, and K, and metal particles such as Fe, Cr, Ni, and Mg, may be leached out of the chamber components when a capacitive or an inductive plasma is struck in the chamber. Incorporation of these mobile ions and metal particles into the deposited films compromises the structural integrity and electrical performance of the devices formed on the substrate. Furthermore, deposits on the chamber components can buildup after a series of substrates have been processed, and become another source of particles that can flake off and damage the circuits, despite being of similar composition.

Particle contamination within the chamber is controlled by periodically cleaning the chamber using cleaning gases, typically fluorinated compounds. Cleaning gases are selected based on their ability to bind the precursor gases and the deposition material which has formed on the chamber components in order to form stable products which can be exhausted from the chamber, thereby cleaning the process environment. In a high density plasma reactor, most cleaning gases containing fluorine (i.e., $NF_3$, $CF_4$, and $C_2F_6$) are highly dissociated and can readily bind the deposition material forming a stable product which can be exhausted from the chamber.

The plasma of the cleaning gas is generated using the remote inductively coupled plasma source 200 attached to the chamber 400. As shown in FIG. 4, a pump 430 is connected to the plasma outlet 220 to pump the plasma through a conduit 432 to the chamber 400. The cleaning process can be accomplished using a plasma of $NF_3$ with the following parameters. Typically, the RF power applied to the remote plasma source is between about 1 kW and about 3 kW. The flow rate of the plasma gas, such as NF3, is preferably between about 100 sccm and about 1000 sccm, and the pressure in the enclosure is between about 1 Torr and about 3 Torr.

Figure 5:
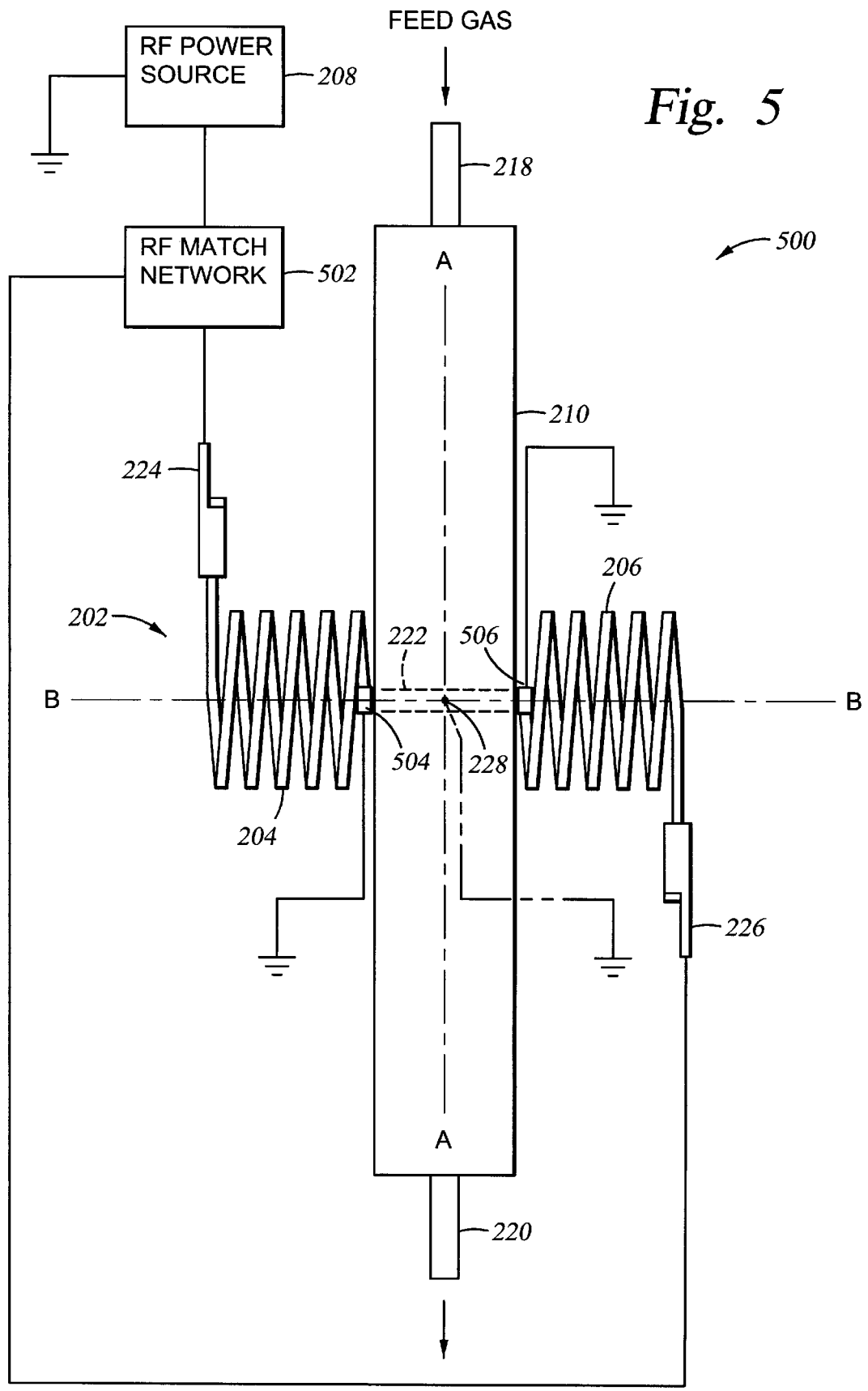
FIG. 5 is a schematic view of a plasma source according to the invention having a central ground coil configuration.
Figure 6:
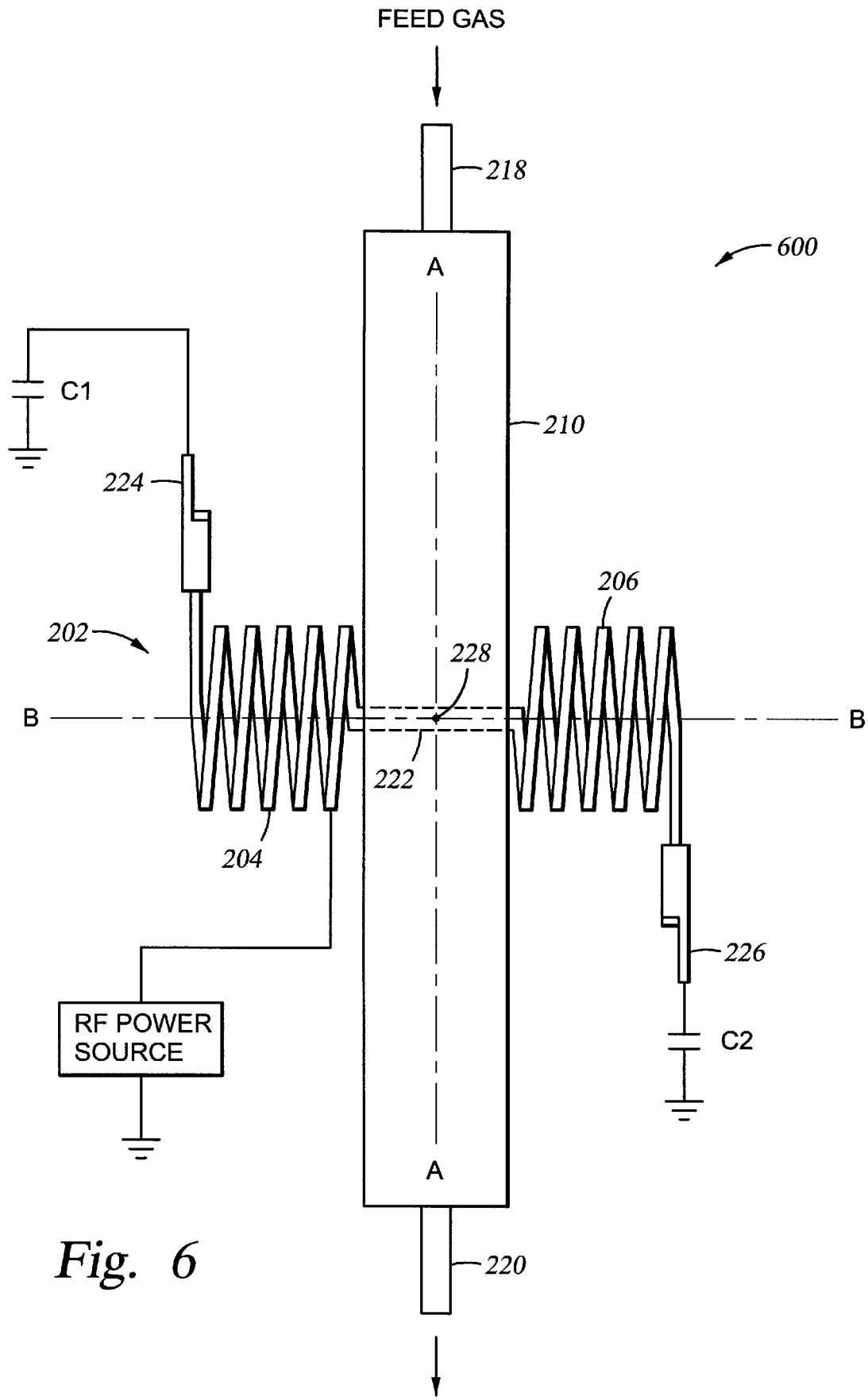
FIG. 6 is a schematic view of a plasma source according to the invention having a self-resonant coil configuration.
Figure 7:
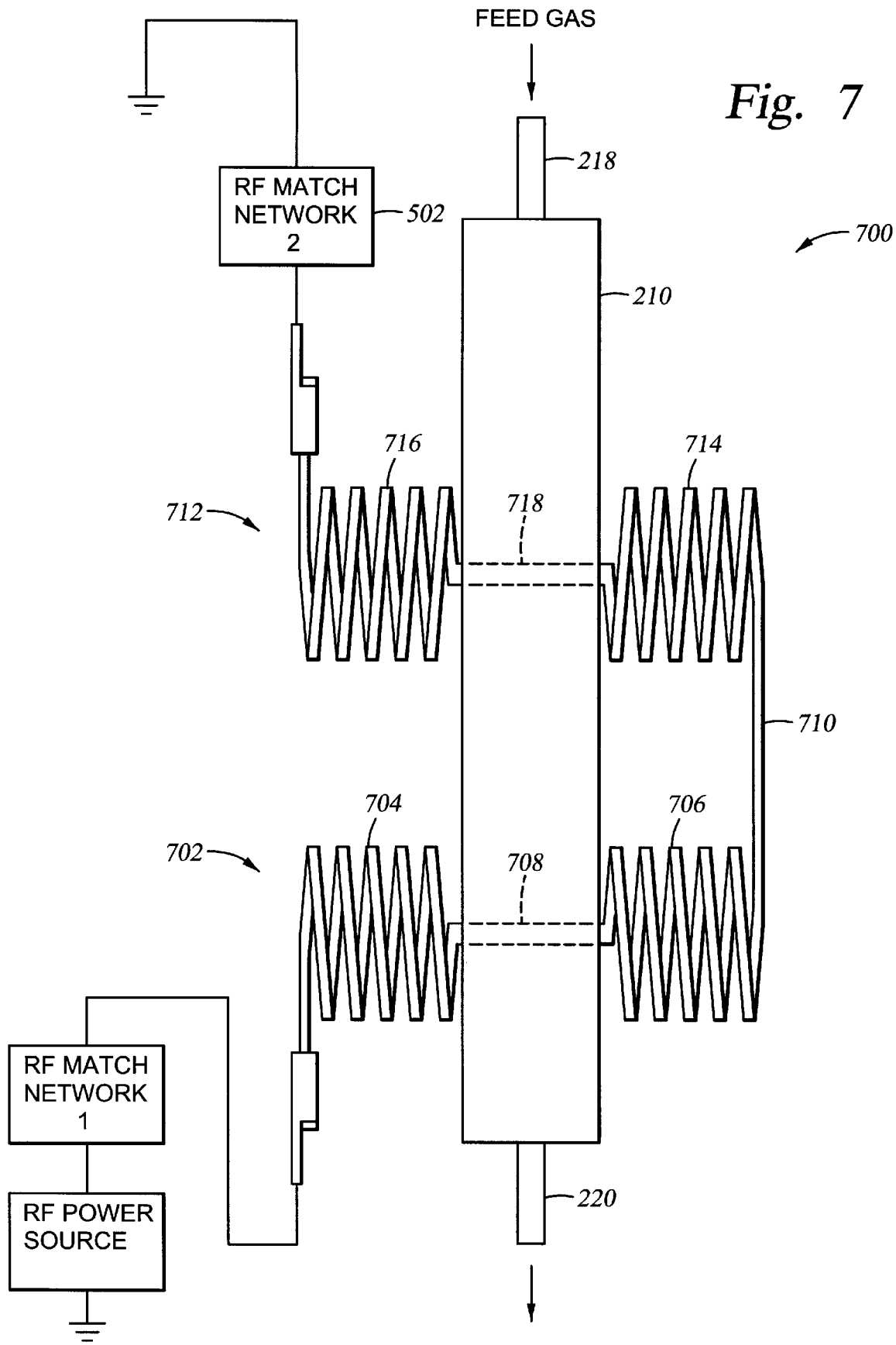
FIG. 7 a schematic view of a plasma source according to the invention having a series coils configuration.

FIGS. 5–7 show alternative embodiments of the invention based on the enclosure/coil configuration described above in FIG. 2.

FIG. 5 is a schematic view of a plasma source 500 according to the invention having a central ground coil configuration. The enclosure 210 is disposed between the first coil segment 204 and the second coil segment 206. The RF power source 208 is connected to an RF match network 502 to supply RF power to the coil segments. The RF match network 502 is connected to the first and second coil terminals 224 and 226 that are located at the outer ends of the coil segments. The inner ends 504, 506 of the coil segments 204, 206 are connected to a ground. For the coil configuration as shown in FIG. 5, the coil segments 204 and 206 do not need to be connected by a middle segment 222 because the inner ends 504, 506 are each grounded. By grounding the inner ends of the coil segments, the voltage of the coil in the vicinity of the enclosure is forced to be zero. Alternatively, when the coil segments 204 and 206 are connected by a middle segment 222, the middle segment 222 is connected to ground through a single connection, preferably at the coil center 228, to achieve the same objective as separately grounding the inner ends 502, 504. By grounding the coil segments 204, 206 at the location of the enclosure 210, the coil configuration as shown in FIG. 5 assures that a zero-voltage node (because of ground) is created at the location of the enclosure 210 and that the enclosure 210 experiences no voltage differential between the coil segments.

FIG. 6 is a schematic view of a plasma source 600 according to the invention having a self-resonant coil configuration. A first capacitor C1 is connected between the first coil segment terminal 224 and the ground while a second capacitor C2 is connected between the second coil segment terminal 226 and the ground. The values of the capacitors C1 and C2 are selected to match the coil segments 204 and 206, respectively, to provide a resonant operation. The RF power source 208 is connected to one of the coil segments (i.e., either first coil segment 204 or second coil segment 206) without an RF match network. As shown in FIG. 5, the RF power source 208 is connected to the first coil segment 204. Alternatively, the RF power source 208 is connected to the middle segment 222 without an RF match network to provide a center-tapped self resonant operation. As another alternative, the RF power source 208 is connected to the second coil segment 206 without an RF match network. The location of the connection of the RF power source to the coil is another factor in determining the values of the capacitors C1 and C2 to provide self-resonant operation. The center-tapped self-resonant coil configuration as shown in FIG. 6 eliminates complicated matching networks by using only one capacitor for each coil segment to maximize the efficiency of the system.

FIG. 7 a schematic view of a plasma source 700 according to the invention having a series coils configuration. The series coils configuration includes a first coil 702 comprising a first coil segment 704 and a second coil segment 706 connected by a first middle segment 708, and a second coil 712 comprising a third coil segment 714 and a fourth coil segment 716 connected by a second middle segment 718. A connection segment 710 connects the second coil segment 706 and the third coil segment 714. The enclosure 210 is disposed between the first and second coil segments and between the third and fourth coil segments. Preferably, a first match network 714 is connected between the first coil segment 702 and the RF power source 208, and a second match network 716 is connected between the fourth coil segment 708 and the ground. By disposing the enclosure 210 between two sets of coil segments, the cross sectional area of the coils that intersect the enclosure is increased (compared to the cross sectional area of one set of coil segments), resulting in an increased active region for exciting the gas within the enclosure 210 to a plasma. Also, the coil voltage is divided between more coil segments, resulting in a lower maximum voltage applied across each coil segment. The invention contemplates providing additional pairs of coil segments in series to further increase the active region for exciting the gas within the enclosure 210. The invention also contemplates providing a plurality of coils (i.e., pairs of coil segments) connected in a parallel configuration to increase the active region for exciting the gas within the enclosure 210.

While the foregoing is directed to the preferred embodiment of the present invention, other and further embodiments of the invention may be devised without departing from the basic scope thereof. The scope of the invention is determined by the claims which follow.

What is claimed is:

1. An apparatus for providing a plasma from a remote location to a processing chamber, comprising:

a) a coil having a first coil segment and a second coil segment;

b) an RF power source connected to the coil; and c) an enclosure disposed between the first coil segment and the second coil segment.

2. The apparatus of claim 1, further comprising:

d) a first RF match network connected between the RF power source and the first coil segment; and e) a second RF match network connected between the second coil segment and a ground.

3. The apparatus of claim 1 wherein an axis through the enclosure is substantially perpendicular to an axis through the coil.

4. The apparatus of claim 1 wherein the first and second coil segments comprise solenoidal windings.

5. The apparatus of claim 1 wherein the first and second coil segments have ferrite cores.

6. The apparatus of claim 1 wherein the coil has an elongated cross-section having a long cross sectional axis extending in a same direction as an axis through the enclosure.

7. The apparatus of claim 6 wherein the coil has an elliptical cross-sectional shape.

8. The apparatus of claim 6 wherein the coil has a rectangular cross-sectional shape.

9. The apparatus of claim 1 wherein the enclosure comprises a cylindrical enclosure having a gas inlet connectable to a gas source and a plasma outlet connectable to the process chamber.

10. The apparatus of claim 9 wherein the enclosure comprises a dielectric material.

11. The apparatus of claim 1 wherein the RF power source is connected to an outer end of each coil segment and wherein an inner end of each coil segment is connected to a ground.

12. The apparatus of claim 11 wherein the coil includes a grounded middle segment connecting the inner ends of the coil segments, wherein the enclosure is disposed adjacent the grounded middle segment.

13. The apparatus of claim 11, further comprising:
   d) an RF match network connected between the RF power source and the coil segments.

14. The apparatus of claim 1, further comprising:
   d) a first capacitor connected between an outer end of the first coil segment and ground; and
   e) a second capacitor connected between an outer end of the second coil segment and ground.

15. The apparatus of claim 14 wherein the RF power source is connected to a middle coil segment between the first coil segment and the second coil segment.

16. The apparatus of claim 1 wherein the coil further comprises a third coil segment and a fourth coil segment and wherein the enclosure is disposed between the third coil segment and the fourth coil segment.

17. The apparatus of claim 16, further comprising:
   d) a first RF match network connected between the RF power source and the first coil segment; and
   e) a second RF match network connected between the fourth coil segment and a ground.

18. The apparatus of claim 1, further comprising:
   d) a faraday shield disposed between the enclosure and the coil segments.

19. An apparatus for plasma processing, comprising:
   a) a processing chamber; and
   b) a remote plasma source, comprising:
      i) a coil having a first coil segment and a second coil segment;
      ii) an RF power source connected to the coil; and
      iii) an enclosure having a gas inlet connected to a gas source and a plasma outlet connected to the chamber, the enclosure disposed between the first coil segment and the second coil segment.

20. The apparatus of claim 19, wherein the remote plasma source further comprises:
   iv) a first RF match network connected between the RF power source and the first coil segment; and
   v) a second RF match network connected between the second coil segment and a ground.

21. The apparatus of claim 19 wherein the enclosure comprises a dielectric material.

22. An apparatus for providing a plasma from a remote location to a processing chamber, comprising:
   a) a coil having a first coil segment, a second coil segment and a middle segment connecting the first and second coil segments;
   b) an RF power source connected to the coil; and
   c) an enclosure disposed between the first coil segment and the second coil segment and adjacent the middle segment.

23. The apparatus of claim 22, further comprising:
   d) a first RF match network connected between the RF power source and the first coil segment; and
   e) a second RF match network connected between the second coil segment and a ground.

24. The apparatus of claim 22 wherein an axis through the enclosure is substantially perpendicular to an axis through the coil.

25. The apparatus of claim 22 wherein the coil has an elongated cross-section having a long cross sectional axis extending in a same direction as an axis through the enclosure.

26. The apparatus of claim 22 wherein the enclosure comprises a cylindrical dielectric enclosure having a gas inlet and a plasma outlet.

27. The apparatus of claim 22, further comprising:
   d) an RF match network connected between the RF power source and an outer end of each coil segment; and
   wherein the middle segment is connected to a ground.

28. A method for generating a plasma from a remote location to a chamber, comprising:
   a) disposing an enclosure between a first coil segment and a second coil segment;
   b) introducing a gas into the enclosure; and
   c) supplying an RF power to the coil segments to excite the gas into a plasma.

29. The method of claim 28, further comprising:
   d) tuning the first coil segment using a first RF match network disposed between an RF power source and the first coil segment; and
   e) tuning the second coil segment using a second RF match network disposed between the second coil segment and a ground.

30. The method of claim 28, wherein the step of supplying an RF power to the coil comprises:
   i) connecting an outer end of each coil segment to the RF power source; and
   ii) grounding an inner end of each coil segment.

31. The method of claim 28, further comprising:
   d) connecting a capacitor to an outer end of each coil segment to operate the coil in a self-resonant mode.

32. The method of claim 29, further comprising:
   f) flowing the plasma from the enclosure to a processing chamber.

33. The method of claim 28, further comprising:
   d) shielding the enclosure using a faraday shield disposed between the enclosure and the coil segments.

34. An apparatus for providing a plasma from a remote location to a processing chamber, comprising:
   a) a coil having a first coil segment and a second coil segment, wherein the coil has an elongated cross-section having a long cross sectional axis extending in a same direction as an axis through the enclosure;
   b) an RF power source connected to the coil; and
   c) an enclosure disposed between the first coil segment and the second coil segment.

35. The apparatus of claim 34 wherein the coil has an elliptical cross-sectional shape.

36. The apparatus of claim 34 wherein the coil has a rectangular cross-sectional shape.

37. The apparatus of claim 34 wherein the coil has a middle segment connecting the first and second coil segments.

* * * * *